United States Patent
Wu et al.

(10) Patent No.: US 11,051,415 B2
(45) Date of Patent: Jun. 29, 2021

(54) METHOD FOR ASSEMBLING AN ELECTRONIC DEVICE

(71) Applicant: Acer Incorporated, New Taipei (TW)

(72) Inventors: Sheng-Wen Wu, New Taipei (TW); Yu-Cheng Huang, New Taipei (TW); Ke-Hua Lin, New Taipei (TW); Shao-Chi Chuang, New Taipei (TW); Wen-Shu Lee, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 293 days.

(21) Appl. No.: 16/131,137

(22) Filed: Sep. 14, 2018

(65) Prior Publication Data
US 2019/0014673 A1   Jan. 10, 2019

Related U.S. Application Data

(62) Division of application No. 15/218,358, filed on Jul. 25, 2016, now Pat. No. 10,123,437.

(30) Foreign Application Priority Data

Sep. 3, 2015   (TW) .................................. 104129125

(51) Int. Cl.
*H05K 5/02*   (2006.01)
*H05K 5/00*   (2006.01)

(52) U.S. Cl.
CPC ......... *H05K 5/0217* (2013.01); *H05K 5/0017* (2013.01)

(58) Field of Classification Search
CPC ......................... H05K 5/0017; H05K 5/0217
See application file for complete search history.

(56) References Cited

U.S. PATENT DOCUMENTS

| | | | | |
|---|---|---|---|---|
| 3,910,029 | A | * 10/1975 | Yamazaki | G04G 17/045 368/84 |
| 4,083,177 | A | 4/1978 | Nishimura | |
| 8,773,847 | B2 | 7/2014 | Byun et al. | |
| 2002/0047952 | A1* | 4/2002 | Kawata | G04G 17/045 349/58 |
| 2008/0037374 | A1 | 2/2008 | Chu et al. | |

(Continued)

FOREIGN PATENT DOCUMENTS

| CN | 103605278 | 2/2014 |
|---|---|---|
| DE | 20 2015 004 098 U1 | 9/2015 |

(Continued)

OTHER PUBLICATIONS

European Search Report dated Feb. 3, 2017, issued in application No. 16186280.0-1803.

(Continued)

*Primary Examiner* — Minh N Trinh
(74) *Attorney, Agent, or Firm* — McClure, Qualey & Rodack, LLP

(57) ABSTRACT

A method for assembling the electronic device is provided, including providing a band member, forming a buffer structure on the band member by overmolding, pulling the band member out of the buffer structure to form a channel in the buffer structure, providing a flexible circuit, and disposing the flexible circuit through the channel.

5 Claims, 11 Drawing Sheets

(56) References Cited

U.S. PATENT DOCUMENTS

| | | | |
|---|---|---|---|
| 2011/0053666 A1* | 3/2011 | Kang | H04M 1/02 |
| | | | 455/575.6 |
| 2013/0187789 A1 | 7/2013 | Lowe | |
| 2014/0169033 A1 | 6/2014 | Yu et al. | |
| 2015/0234426 A1 | 8/2015 | Bailey et al. | |
| 2015/0359099 A1 | 12/2015 | Pennathur et al. | |
| 2019/0014673 A1* | 1/2019 | Wu | H05K 5/0217 |

FOREIGN PATENT DOCUMENTS

| | | |
|---|---|---|
| TW | 201303534 | 1/2013 |
| TW | M487716 | 10/2014 |
| WO | 2014/107158 A1 | 7/2014 |

OTHER PUBLICATIONS

Chinese language office action dated Oct. 14, 2016, issued in application No. TW 104129125.

* cited by examiner

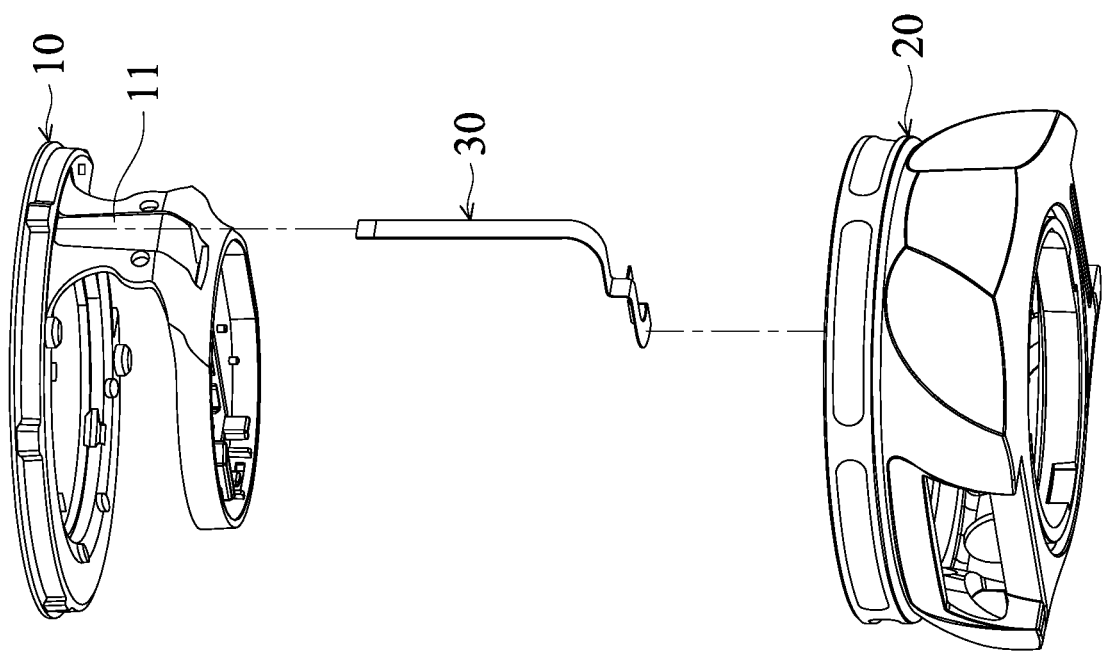

METHOD FOR ASSEMBLING AN ELECTRONIC DEVICE

CROSS REFERENCE TO RELATED APPLICATIONS

This application is a Divisional of application Ser. No. 15/218,358, filed Jul. 25, 2016 and entitled "ELECTRONIC DEVICE AND ASSEMBLY METHOD THEREOF", now U.S. Pat. No. 10,123,437, which is based on, and claims priority from, Taiwan Patent Application No. 104129125, filed on Sep. 3, 2015, the disclosure of which is hereby incorporated by reference herein in its entirety.

BACKGROUND OF THE INVENTION

Field of the Invention

The application relates in general to an electronic device, and in particular, to an electronic device having a flexible circuit and an assembly method thereof.

Description of the Related Art

The hosing of conventional wearable electronic products (such as smart watches or smart bands) is usually formed by double injection molding in order to make them waterproof and shockproof. A flexible circuit board (such as a flexible print circuit, FPC) can be embedded into the plastic material by overmolding or a liquid silicone rubber (LSR) process, to electrically connect the flexible circuit board with other electronic components.

However, once the flexible circuit is damaged during the overmolding process, it is hard to take the flexible circuit out of the plastic material. Therefore, the flexible circuit board must be scrapped along with the plastic materials, and the cost of production increases.

BRIEF SUMMARY OF INVENTION

To address the deficiencies of conventional electronic products, an embodiment of the invention provides an electronic device including a housing, a channel, and a flexible circuit. The housing includes a frame and a buffer structure connected to the frame by overmolding, wherein the hardness of the frame exceeds that of the buffer structure. The channel is extended along a sidewall of the frame, through the housing and adjacent to the buffer structure. The flexible circuit is disposed through the channel to connect a first circuit unit and a second circuit unit of the electronic device.

A method for assembling the electronic device also provided in the invention, including providing a band member, forming a buffer structure on the band member by overmolding, and pulling the band member out of the buffer structure to form a channel in the buffer structure.

BRIEF DESCRIPTION OF DRAWINGS

The invention can be more fully understood by reading the subsequent detailed description and examples with references made to the accompanying drawings, wherein:

FIG. 1A is an exploded diagram of an electronic device according to an embodiment of the invention;

DETAILED DESCRIPTION OF INVENTION

The making and using of the embodiments of the electronic device are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Figure 1B:
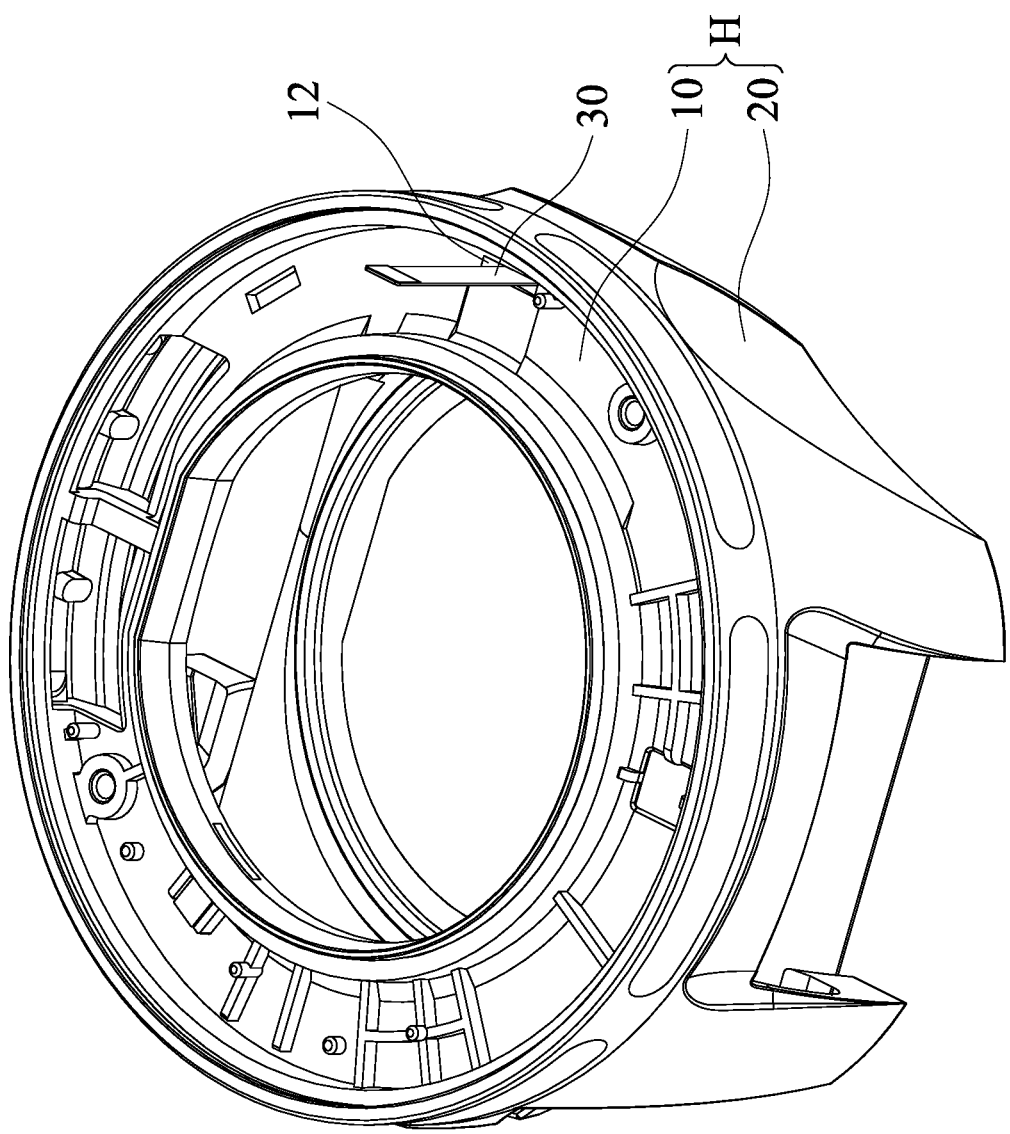
FIGS. 1B-1C are perspective diagrams of the electronic device in FIG. 1A after assembly.
Figure 1C:
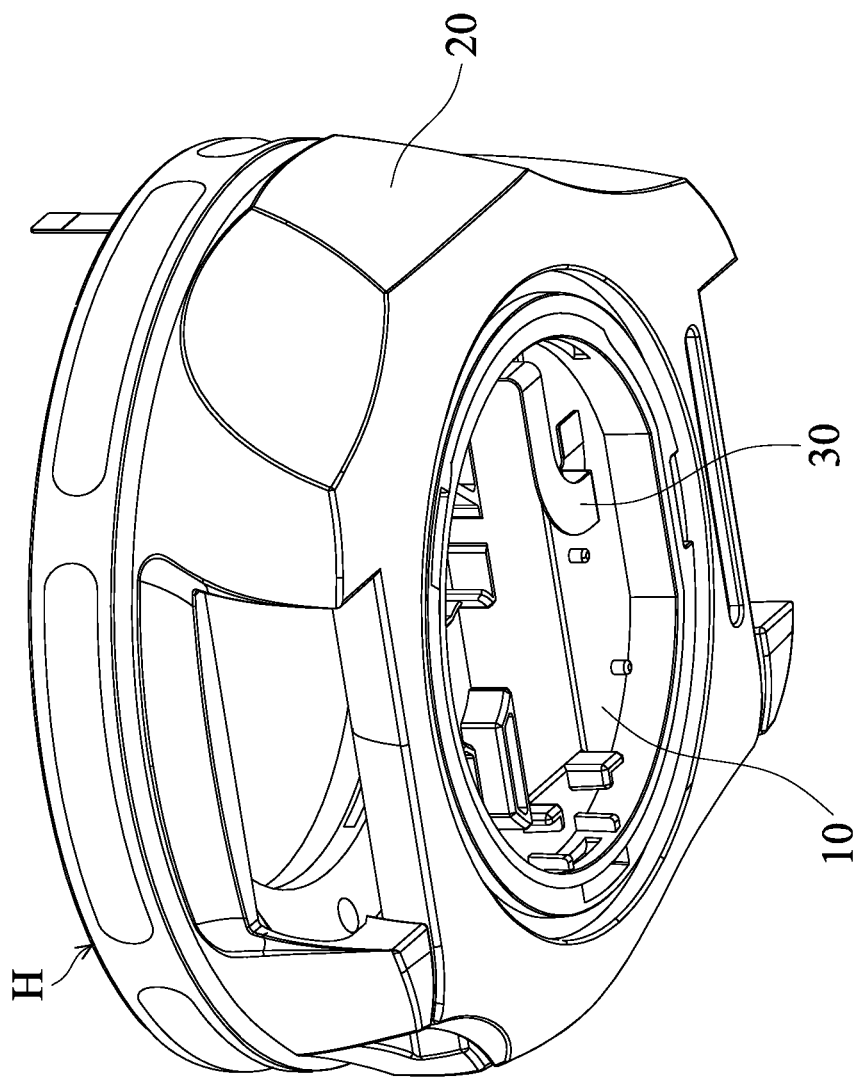

Referring to FIGS. 1A-1C, an electronic device of this embodiment is a wearable electronic device (e.g. a smart watch or a smart band). With a strap or flexible member (not shown), the electronic device can be worn on a user. However, the electronic device can also be directly attached to the main body of a watch, such that the user can wear it. As shown in FIGS. 1A-1C, the electronic device primarily comprises a frame 10, a buffer structure 20, and a flexible circuit 30, wherein the frame 10 may comprise polycarbonate (PC), and the buffer structure 20 may comprise thermoplastic polyurethane (TPU). It should be understood that, the buffer structure 20 is formed on the frame 10 by overmolding, and a housing H of the electronic device is formed by the frame 10 and the buffer structure 20. Specifically, the hardness of the frame 10 exceeds that of the buffer structure 20 after both of them are formed by molding. Furthermore, as shown in FIGS. 1D-1E, the flexible circuit 30 is disposed through a channel C of the housing H, so as to connect a first circuit unit E1 with a second circuit unit E2, which are respectively disposed on the upper and lower sides of the housing H (the first and second circuit units E1 and E2 are omitted in the other drawings).

Figure 1D:
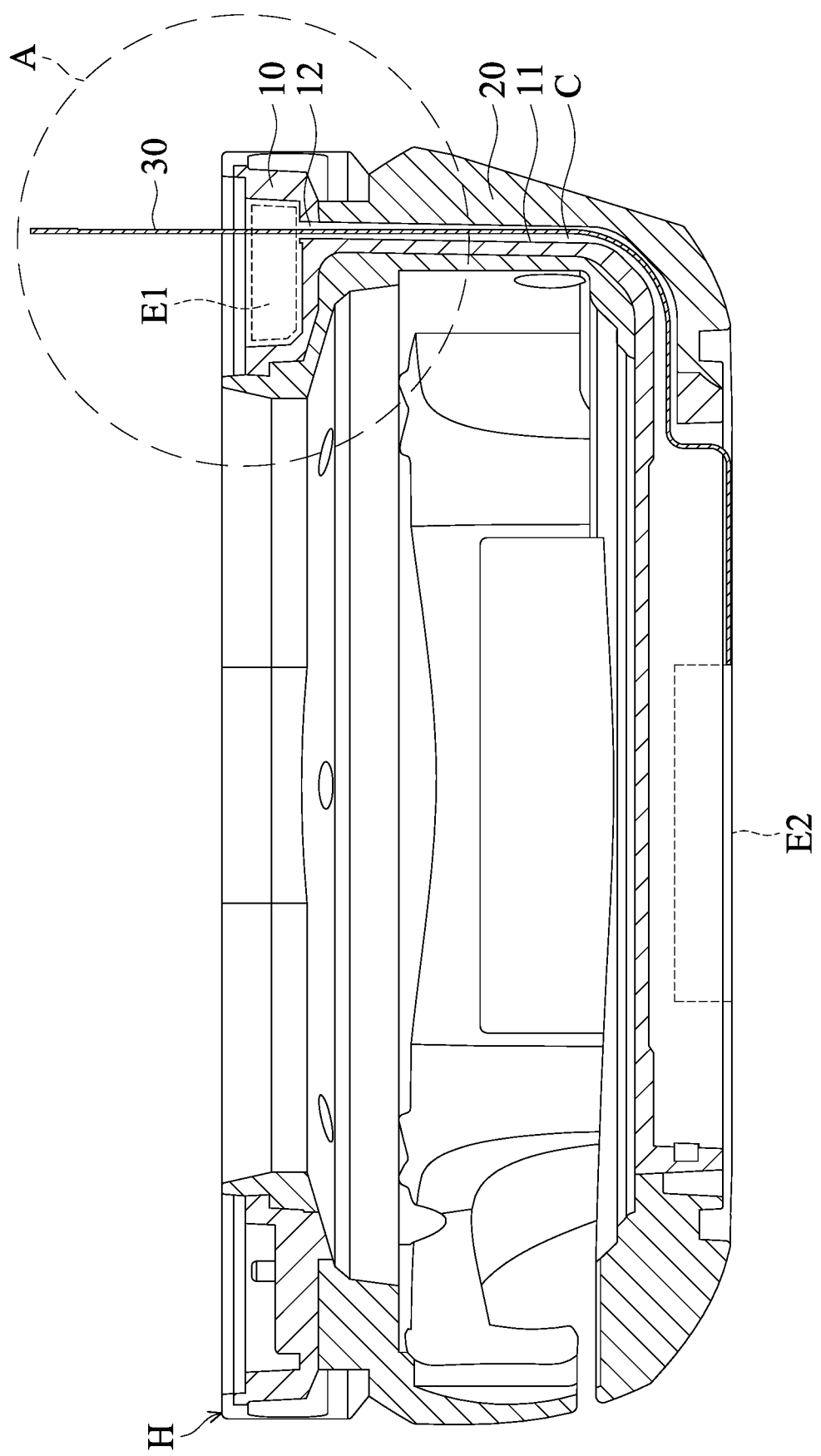
FIG. 1D is cross-sectional view of the frame, the buffer structure, and the flexible circuit in FIGS. 1B-1C.
Figure 1E:
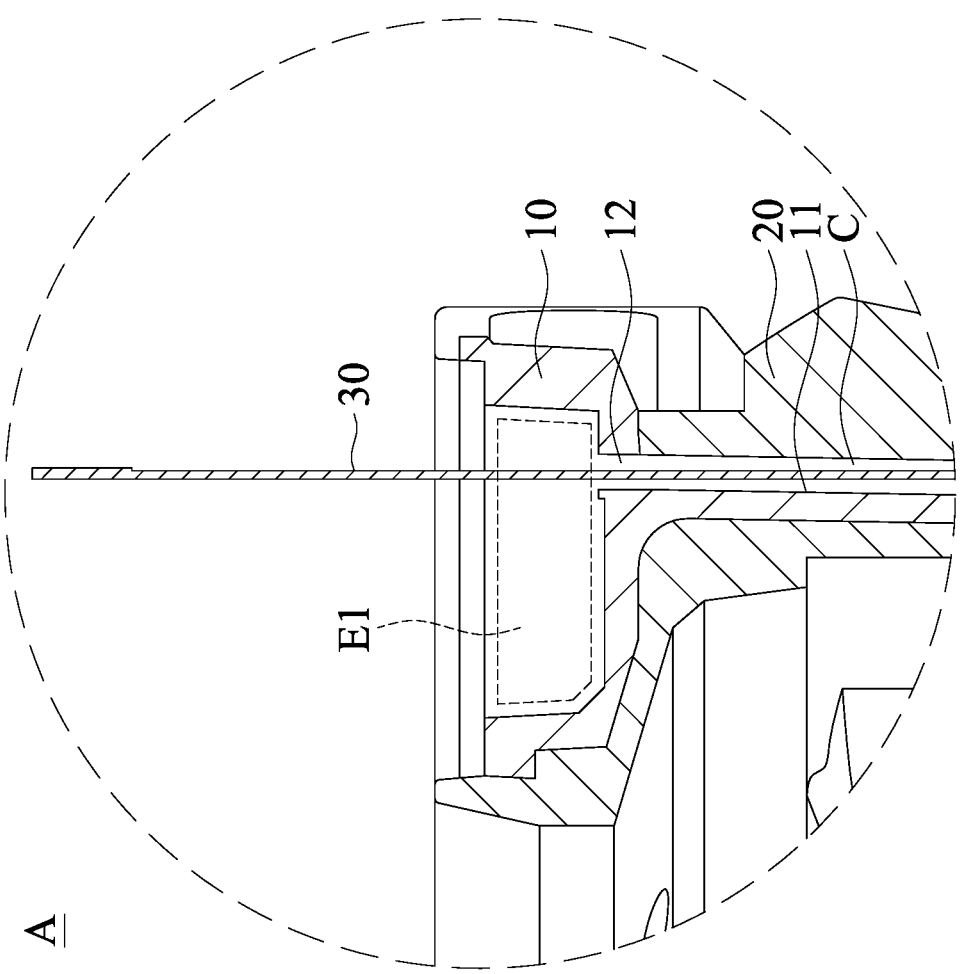
FIG. 1E is an enlarged view of the portion A in FIG. 1D.

It can be clearly seen from FIGS. 1D-1E that the channel C is extended along a sidewall 11 of frame 10, and a side of channel C is adjacent to the buffer structure 20. During assembly, the flexible circuit 30 can be disposed to enter the channel C from a hole 12 in the upper side of the housing H and extended through the frame 10. Subsequently, the flexible circuit 30 can be extended downward via the channel C to reach the bottom of the housing H, to connect the first and second circuit units E1 and E2 respectively on the upper and lower sides of the housing H.

Figure 2A:
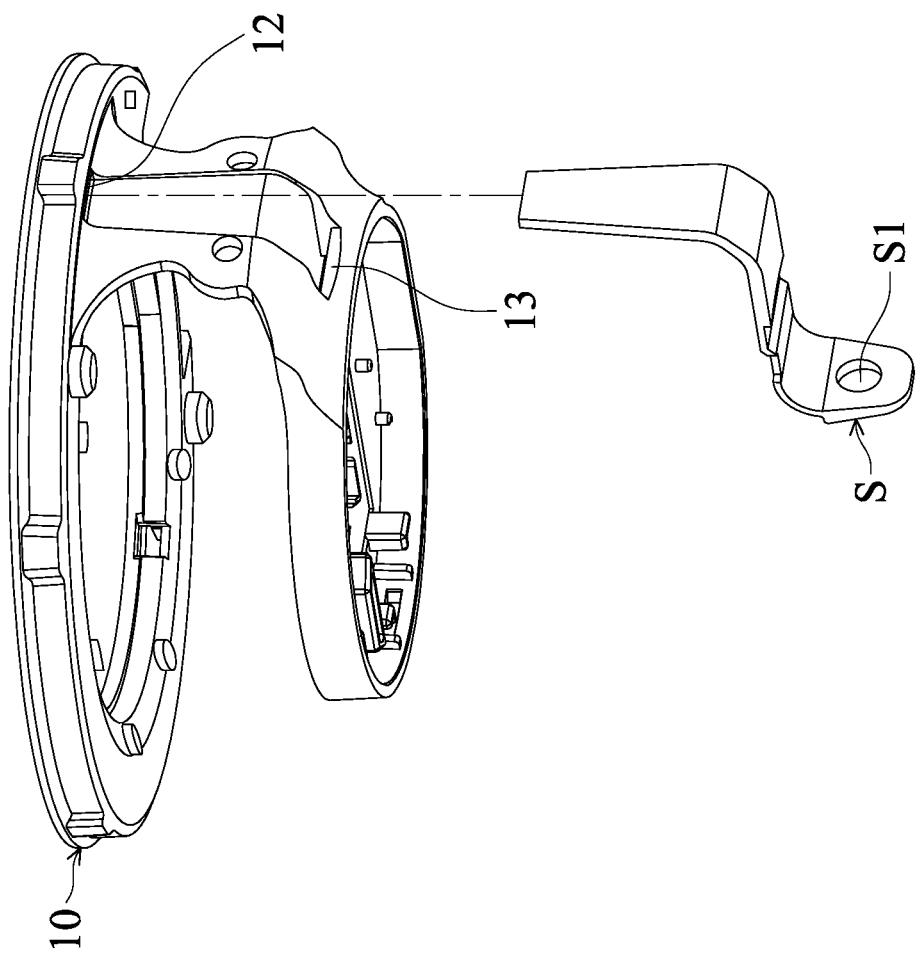
FIG. 2A is a schematic diagram of a frame and a band member according to an embodiment of the invention.
Figure 2B:
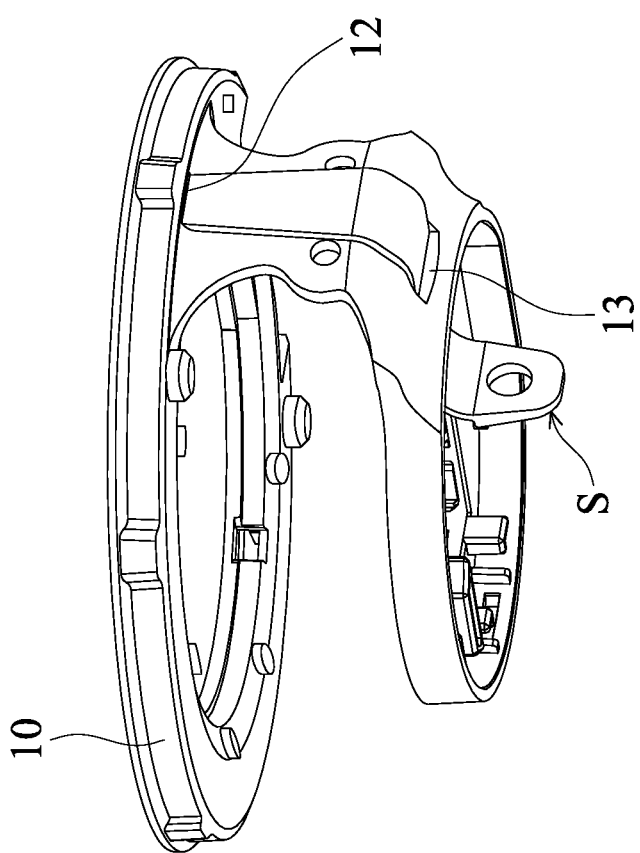
FIG. 2B is a schematic diagram of the band member and the frame connected to each other.
Figure 2C:
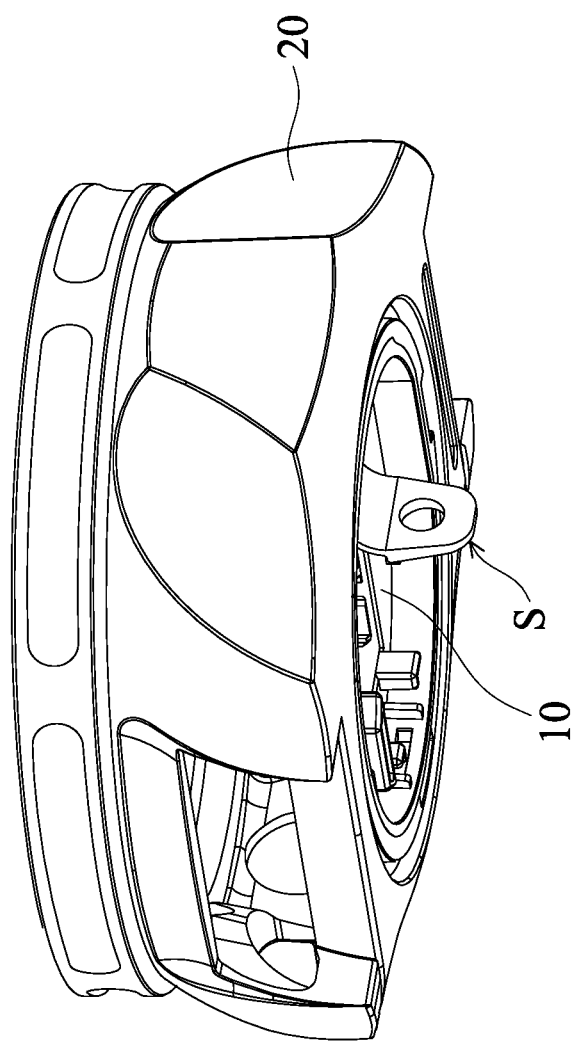
FIG. 2C is a schematic diagram of the buffer structure formed on the frame and the band member.
Figure 2D:
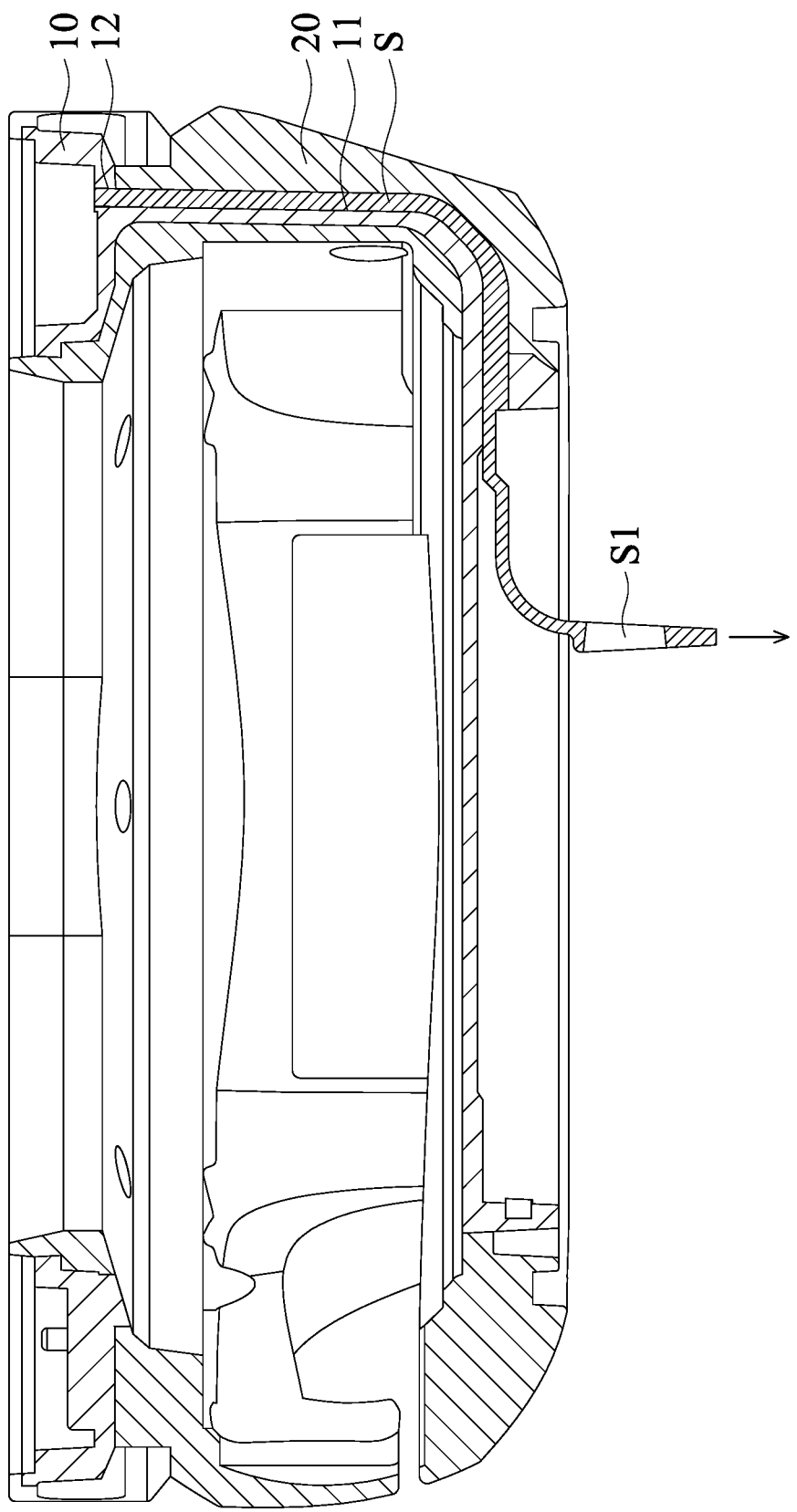
FIG. 2D is a cross-sectional diagram of the frame, the band member, and the buffer structure in FIG. 2C.
Figure 2E:
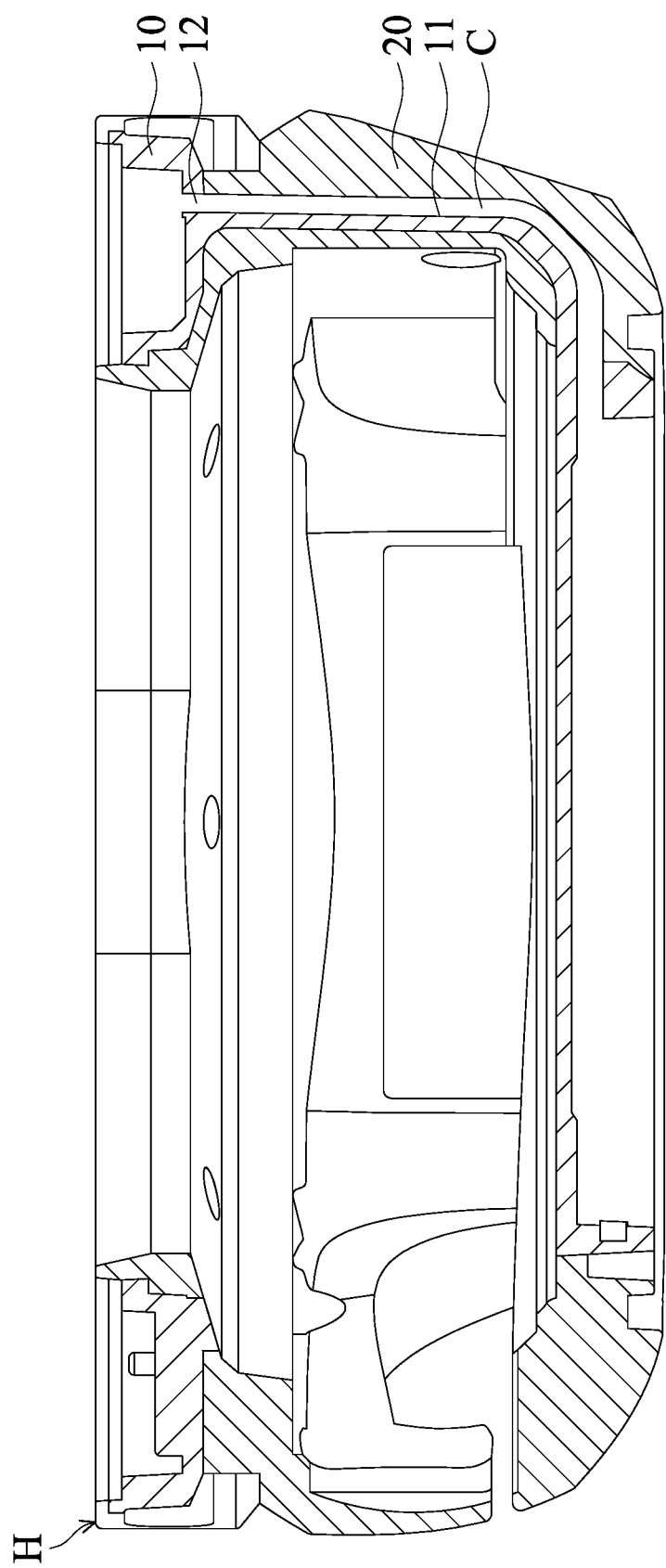
FIG. 2E is a cross-sectional diagram of the frame and the buffer structure in FIG. 2D when the band member is pulled out.

FIGS. 2A-2E are perspective diagrams illustrating a method for assembling the electronic device. As shown in FIG. 2A, the first step is to provide the frame 10 in FIG. 1A, wherein the frame 10 may comprise polycarbonate and may be formed by overmolding. The next step is to provide a band member S and attach the band member S to the frame 10. In this embodiment, the band member S is joined in the hole 12 which is extended through the frame 10, and the band member S is extended through an opening 13 (as shown in FIG. 2B) on the lower side of the frame 10. The band member S may comprise polyoxymethylene (POM), polyamide (PA), or high-density polyethylene (HDPE). Subsequently, the buffer structure 20 can be formed on the frame 10 and the band member S by overmolding (as shown in FIGS. 2C-2D). The buffer structure 20 may comprise thermoplastic polyurethane (TPU).

After the buffer structure 20 is formed, the band member S can be easily pulled out via a perforation S1 on an end of the band member S (in the direction shown in FIG. 2D), so that the band member S is separated from the frame 10 and the buffer structure 20 with a channel C (FIG. 2E) formed therebetween. Thus, the frame 10 and the buffer structure 20 can form the housing H of the electronic device. It should be noted that, as the buffer structure 20 comprises thermoplastic polyurethane, "pseudo-bonding" between the buffer structure 20 and polyoxymethylene, polyamide, or high-density polyethylene material of the band member S can occur during the molding process. The pseudo-bonding means that when the plastic material is melted and injected by high temperature, two components can adhere to each other without molecular-bonding therebetween, so that they can still be separated by an external force. Therefore, after the buffer structure 20 is molded, the band member S can be pulled out of the frame 10 and the buffer structure 20 smoothly, and the structure of the buffer structure 20 would not be damaged. By pulling the buffer structure 20 out of the frame 10, the channel C can be formed in the housing H to receive other elements. Finally, as shown in FIGS. 1D-1E, when the channel C is formed, the flexible circuit 30 can be disposed through the channel C to connect the first and second electronic units E1 and E2 respectively on the upper and lower sides of the housing H.

Figure 3:
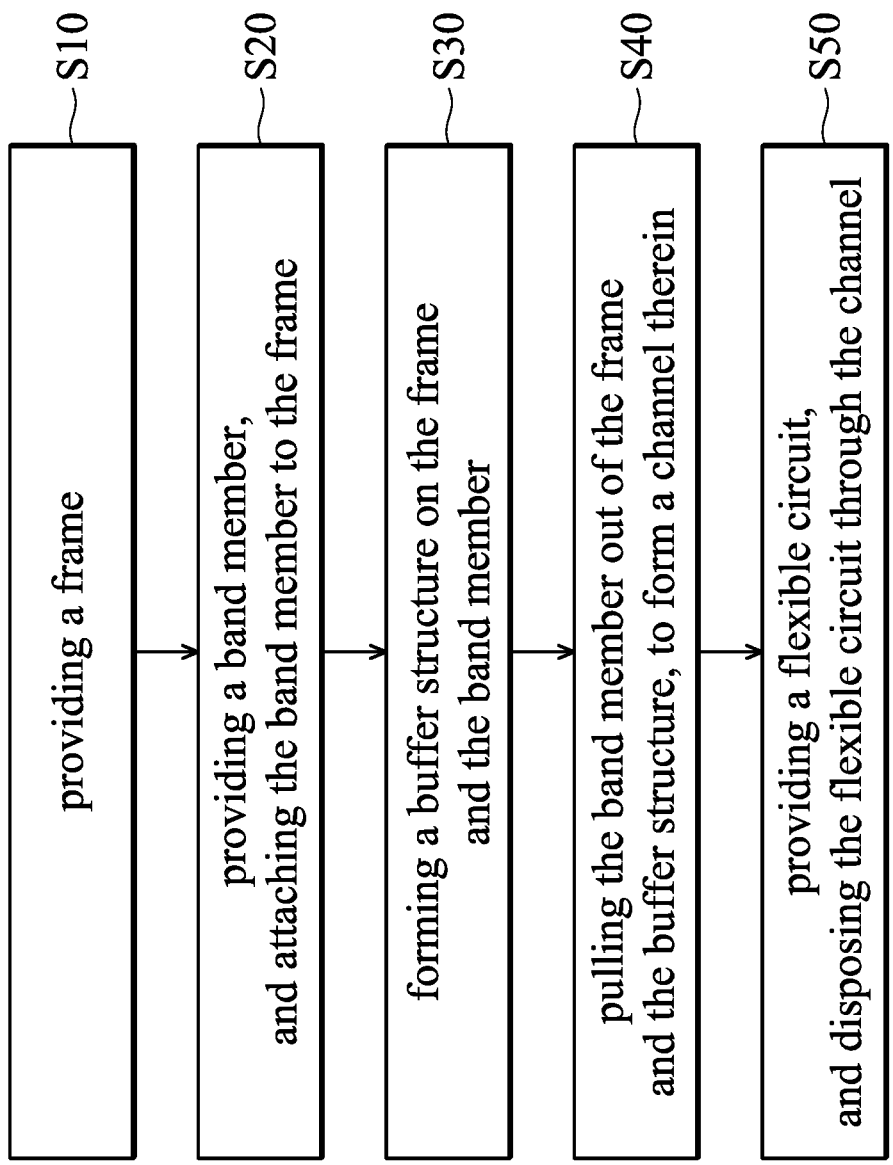
FIG. 3 is a diagram showing a method for assembling an electronic device according to an embodiment of the invention.

As described above, a method for assembling the electronic device is provided and shown in FIG. 3. The first step is to provide a frame (step S10). The next step is to provide a band member and attach the band member to the frame (step S20). Subsequently, a buffer structure is formed on the frame and the band member by overmolding (step S30), and the band member can be pulled out of the frame and the buffer structure to form a channel in the frame and the buffer structure (step S40). The final step is to provide a flexible circuit and dispose the flexible circuit through the channel (step S50), so as to connect the first and second electronic units on the upper and lower sides of a housing of the electronic device.

However, according to another embodiment of the invention, the frame 10 can also be omitted. The steps for assembling the electronic device can include providing a band member S and molding a buffer structure 20 on the band member S by overmolding, and pulling the band member S out of the buffer structure 20 to form a channel C in the buffer structure 20. Since the buffer structure 20 may comprise thermoplastic polyurethane, "pseudo-bonding" between buffer structure 20 and polyoxymethylene, polyamide, or high-density polyethylene material of the band member S can occur during the molding process, so that the band member S can be pulled out of the buffer structure 20 smoothly, and the buffer structure 20 can be prevented from damage after the molding process.

In summary, the present invention is different from the conventional electronic device which has a flexible circuit embedded in a plastic housing by overmolding. In contrast, the invention previously form a channel C in the housing H, and a flexible circuit 30 is disposed through the channel C to connect the first and second electronic units E1 and E2 on the upper and lower sides of the housing H. As a result, unintentional damage to the flexible circuit 30 that occurs during the process can be reduced. Moreover, the flexible circuit 30 can also be easily pulled out of the housing H via the channel C when the flexible circuit 30 is damaged during the assembly or usage of the electronic device. Thus, the invention can address the conventional problems wherein it is difficult to take the flexible circuit out of the plastic member. In the invention, the flexible circuit would not be scrapped with the plastic member, greatly reducing the cost of production.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A method for assembling an electronic device, comprising:
   providing a band member;
   forming a buffer structure on the band member by overmolding;
   pulling the band member out of the buffer structure to form a channel in the buffer structure; and
   providing a flexible circuit, and disposing the flexible circuit through the channel.

2. The method for assembling the electronic device as claimed in claim 1, further comprising pseudo bonding the band member to the buffer structure.

3. The method for assembling the electronic device as claimed in claim 1, wherein the band member comprises polyoxymethylene, polyamide, or high-density polyethylene.

4. The method for assembling the electronic device as claimed in claim 1, further comprising:
   providing a frame;
   attaching the band member to the frame;
   forming the buffer structure on the frame and the band member by overmolding; and
   pulling the band member out of the frame and the buffer structure to form the channel in the frame and the buffer structure.

5. The method for assembling the electronic device as claimed in claim 4, wherein the band member is pseudo-bonded to the buffer structure.

* * * * *